United States Patent [19]

Saito et al.

[11] 4,377,784
[45] Mar. 22, 1983

[54] FAULT DETECTION APPARATUS FOR ROTOR WINDING OF ROTARY MACHINE

[75] Inventors: Toshio Saito; Motoya Ito; Noriyoshi Takahashi; Masaki Sato, all of Hitachi, Japan

[73] Assignee: Hitachi, Ltd., Tokyo, Japan

[21] Appl. No.: 215,065

[22] Filed: Dec. 10, 1980

[30] Foreign Application Priority Data

Dec. 12, 1979 [JP] Japan .................................. 54-160385

[51] Int. Cl.³ .......................................... G01R 31/02
[52] U.S. Cl. .............................. 324/158 MG; 324/51; 340/648; 318/490
[58] Field of Search ....................... 318/490; 322/99; 324/158 MG, 127, 51; 340/648

[56] References Cited

U.S. PATENT DOCUMENTS

| | | | |
|---|---|---|---|
| 2,939,074 | 5/1960 | Perrett | 324/158 MG |
| 3,506,914 | 4/1970 | Albright | 318/490 |
| 4,136,312 | 1/1979 | Salon | 324/158 MG |
| 4,199,718 | 4/1980 | Ikeda | 324/158 MG |

FOREIGN PATENT DOCUMENTS 512438  6/1976  U.S.S.R. ...................... 324/158 MG

Primary Examiner—Stanley T. Krawczewicz
Assistant Examiner—Jose M. Solis
Attorney, Agent, or Firm—Antonelli, Terry & Wands

[57] ABSTRACT

A fault detection apparatus for a rotor winding of a rotary machine comprises a peak value hold circuit, a peak value processor and a monitor. The peak value hold circuit holds peak value of a pulsing magnetic flux waveform supplied from a magnetic flux sensor mounted in proximity to a surface of a rotor, for a necessary time period. The peak value processor sequentially compares the peak value held in the peak value hold circuit with corresponding one of pre-stored peak values of the pulsing magnetic flux waveform to determine if a difference therebetween exceeds a preset level. The monitor indicates the presence or absence of fault based on the result of the comparison of the processor.

9 Claims, 11 Drawing Figures

FAULT DETECTION APPARATUS FOR ROTOR WINDING OF ROTARY MACHINE

The present invention relates to a fault detection apparatus for a rotor winding of a rotary machine, and more particularly to a fault detection apparatus for a rotor winding of a large capacity turbine generator.

FIG. 1 shows a fragmentary sectional view, taken along an axial line, of a rotor of a prior art typical large capacity generator. As shown in FIG. 1, the large capacity generator is generally constructed by a stator 12 of laminated iron plates and a rotor 16 which opposes to the stator with a gap 14 therebetween. The rotor 16 is divided into a cylinder portion 18 and an end portion 20. In the cylinder portion 18, insulated conductors of a rotor winding 22 are stacked in slots which extend axially of the rotor. The conductors 22 are pressed down by a wedge 24. The conductors 22 are wound in the slots usually in five to ten layers with each layer being electrically insulated from other layers. The end portion 20 is covered by a hold ring 26.

If an interlayer insulation in at least one slot of the conductor 22 is broken by thermal expansion of the winding or mechanical impact during the operation of the motor so that windings of adjacent layers are shorted, a magnetic unbalance such as unbalance of magnetomotive forces at N-pole and S-pole of the rotor 16 occurs and an abnormal vibration occurs in the rotor 16. As a result, a bearing of the generator may be broken or the insulation of the winding may be broken and the generator may be disabled to operate. Accordingly, the interlayer short-circuit of the rotor winding 22 must be promptly detected for necessary action.

A known method for detecting the interlayer short-circuit of the rotor winding is now explained.

FIG. 2 is a schematic developed view of a rotor periphery taken along the axis of the rotor in FIG. 1, in which FIG. 2(a) schematically shows a flow of magnetic flux.

Magnetic fluxes are categorized in two major categories. One is a fundamental flux 28 shown by a solid line in FIG. 2 and the other is a leakage flux 30 shown by a broken line, which passes to surround the conductors 22 stacked in the slot. In order to trap the leakage flux 30, a magnetic flux sensor such as a stationary search coil 29 is mounted in an air gap 14 shown in FIG. 1 so that a leakage flux generated when a current flows through the rotating rotor winding 22 is trapped.

The magnetic flux sensor for the rotor winding, which uses the search coil is disclosed in U.S. Pat. No. 3,506,914, and a magnetic flux sensor which uses a non-magnetic probe is disclosed in IEEE transactions on Power Apparatus and Systems, Vol. PAS-90, No. 2, 1971, pp. 478-483.

The magnitude of the leakage fluxes corresponding to the slots of the rotor of FIG. 2(a) is shown in FIG. 2(b), in which an ordinate represents a leakage flux intensity and an abscissa represents a peripheral position of the corresponding slots.

The leakage flux intensity of each slot closely relates to a product of a current flowing through the conductors surrounded by the leakage flux and the number of the stacked conductors of the slot, that is an ampere-turn. When the ampere-turn is small, the leakage flux intensity is low, and as the ampere-turn increases the leakage flux intensity increases accordingly.

Accordingly, if an interlayer short-circuit occurs in the conductors of the slot, the ampere-turn of the slot reduces and hence the leakage flux intensity also decreases. Thus, by detecting the reduction in the leakage flux intensity, the interlayer short-circuit of the rotor winding can be detected.

A pulsing waveform voltage which corresponds to the leakage flux is induced in the search coil 29 for sensing the leakage flux as shown in FIG. 2(c). In FIG. 2(c), an ordinate represents an induced voltage magnitude and an abscissa represents a peripheral position of the slots.

When the rotor winding is not short-circuited, a pulsing waveform as shown by a solid line 23 appears. If an interlayer short-circuit occurs at the conductor in a slot 21a, a peak value of the pulsing waveform is reduced as shown by a broken line 25 in FIG. 2(c).

In a two-pole rotary machine such as a turbine generator, the leakage fluxes at a slot deviated by a given electrical angle from a N-pole and a slot deviated by the same electrical angle from a S-pole, i.e. a slot deviated by 180° from the former slot, are generally equal in magnitude and opposite in polarity. These two slots are hereinafter referred to corresponding slots. In FIG. 2(c), corresponding two pulses are shown by the same suffix. Accordingly, a voltage induced in the leakage flux sensing search coil has a symmetricity between the two corresponding slots deviated by 180° to each other.

As a result, by comparing the peak value of the pulsing waveform of the voltage induced in the search coil for a slot with the peak value of the pulsing waveform for the corresponding slot (which is 180° out of phase), for example, comparing the peak value $P_{n-4}$ in FIG. 2(c) with the peak value $Q_{n-4}$ to determine if there is an appreciable difference therebetween, it is determined that an interlayer short-circuit has occured in the rotor winding in the slot which presents smaller peak value. In FIG. 2(c), a pair of positive and negative pulses, e.g., $P_1$ and $P_2$ correspond to one slot. The corresponding slots are deviated by 180° or 540° to each other in a four-pole rotary machine. Namely, the corresponding slots means those deviated by $(2n+1) \times 180°$ ($n=0, 1, 2 \ldots$) to each other.

In the prior art method, a signal waveform from the magnetic flux sensor is photographed or displayed on an oscilloscope screen and it is examined by an operator to compare the peak values of the corresponding slots to determine the presence or absence of the interlayer short-circuit. This takes manpower and considerable time and hence it is inefficient and can not handle an emergent case.

Accordingly, it has been desired to monitor the presence or absence of the interlayer short-circuit of the rotor winding of the turbine generator or the like on an on-line basis.

For this purpose, it may be possible to provide an apparatus which automatically determine the presence or absence of the interlayer short-circuit which has heretofore been determined by the operator. However, such an apparatus has the following disadvantages.

In the two pole turbine generator, the rotor usually rotates at a high rotation speed such as 3,600 rpm. As a result, a time interval between the peaks generated in the output pulsing waveform of the magnetic flux sensing search coil is very short. For example, when an angle occupied by a slot portion between N-pole and S-pole magnetic poles of the two-pole turbine generator is approximately 60 degree and the number of slots in the slot portion is 32, the time interval between the peak values generated in the pulsing waveform of the magnetic flux sensing search coil is approximately 350 microseconds. In addition, the pulsing waveform is almost of sawtooth wave as shown in FIG. 2(c) so that a peak period of the waveform is very short. Accordingly, it is very difficult to apply a correct peak value of the pulsing waveform to an automatic apparatus connected to an output terminal of the search coil to detect the presence or absence of the interlayer short-circuit.

Furthermore, since the turbine generator is a synchronous machine, the rotation speed is substantially fixed. However, because of slight variation included in the rotation speed, the peak values of the pulsing waveform does not exactly repeat periodically. Thus, in the method of applying the peak value at a predetermined time interval to the automatic handling apparatus, the peak value can not be exactly applied and a smaller value at a point off the peak point may be applied and the automatic handling apparatus may determine the presence or absence of the interlayer short-circuit based on the smaller value. As a result, the automatic handling apparatus may make an erroneous decision.

For this reason, an apparatus for automatically detecting the interlayer short-circuit in the rotor winding of the turbine generator or the like has not been attained.

It is an object of the present invention to provide a fault detection apparatus for a rotor winding of a rotary machine, which automatically, rapidly and exactly detects and indicates the fault such as interlayer short-circuit of the rotor winding.

In order to achieve the above object in accordance with the present invention, there is provided a fault detection apparatus for the rotor winding of the rotary machine, which comprises a peak value hold circuit for holding a peak value of a pulsing magnetic flux waveform supplied from a magnetic flux sensor mounted in proximity to a surface of a rotor, for a necessary time period, a peak value processor for sequentially comparing the peak value temporarily held in the peak value hold circuit with corresponding one of previously stored peak values of the pulsing magnetic flux waveform to determine if the differences exceed a reference level, and a monitor unit for indicating the presence or absence of the fault based on an instruction from the comparator.

The above and other objects, features and advantages of the present invention will be apparent from the following description taken in conjunction with the accompanying drawings, in which:

FIG. 4 is a detailed block diagram of the fault detection apparatus for the rotor winding of the rotary machine in accordance with a first embodiment of the present invention.

Figure 1:
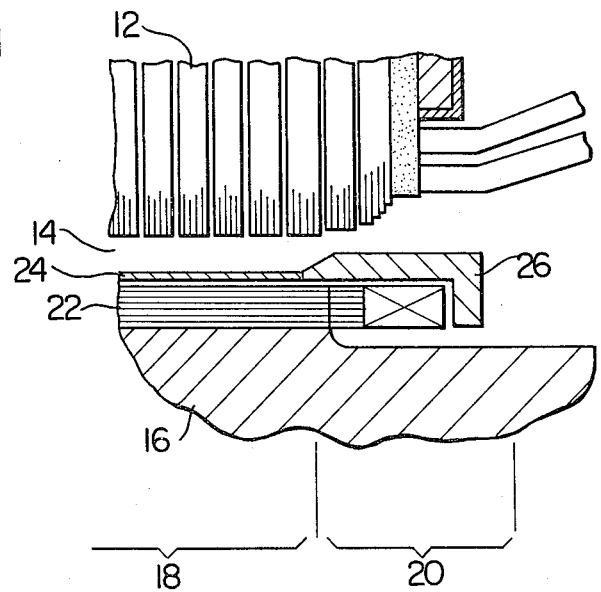
FIG. 1 is a longitudinal sectional view which schematically shows a turbine generator.
Figure 2:
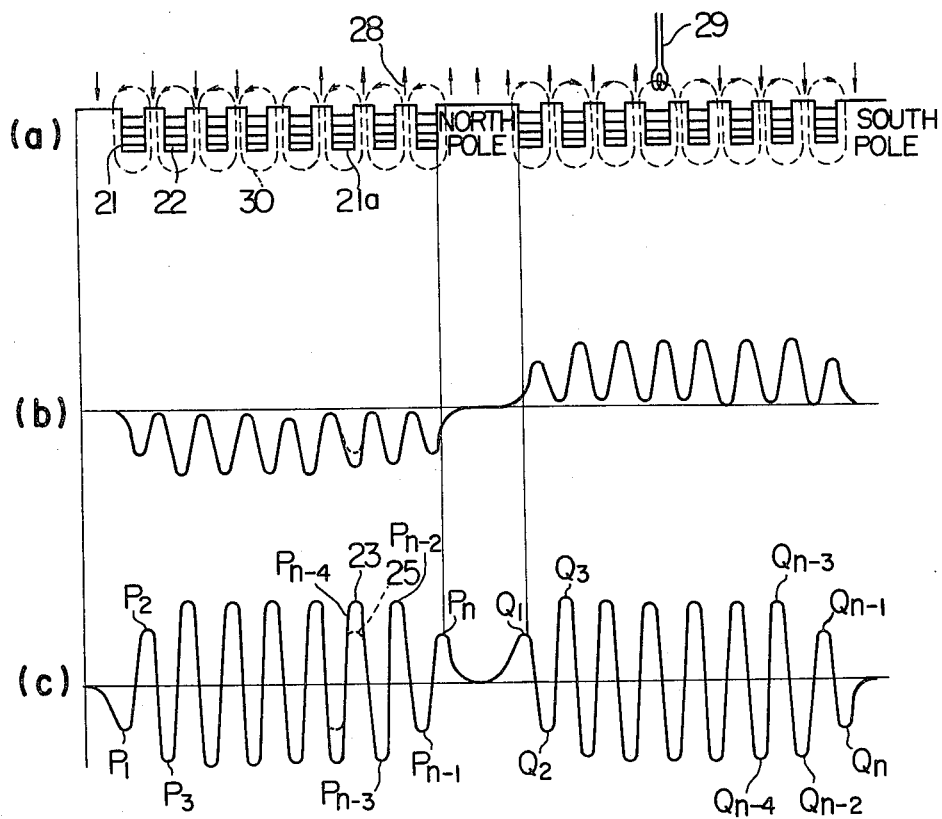
FIG. 2(a) is a schematic developed view of the rotor periphery.
FIG. 2(b) is a diagram showing a pulsing waveform of a leakage flux of the rotor winding.
FIG. 2(c) is a diagram showing a pulsing voltage waveform, corresponding to the leakage magnetic flux, induced in a magnetic flux sensing search coil.

Now, referring to the accompanying drawings, the preferred embodiments of the fault detection apparatus for the rotor winding of the rotary machine in accordance with the present invention will be described in detail. Throughout the drawings, those elements which are identical or similar to those shown in FIGS. 1 and 2 are designated by the same reference numerals.

Figure 3:
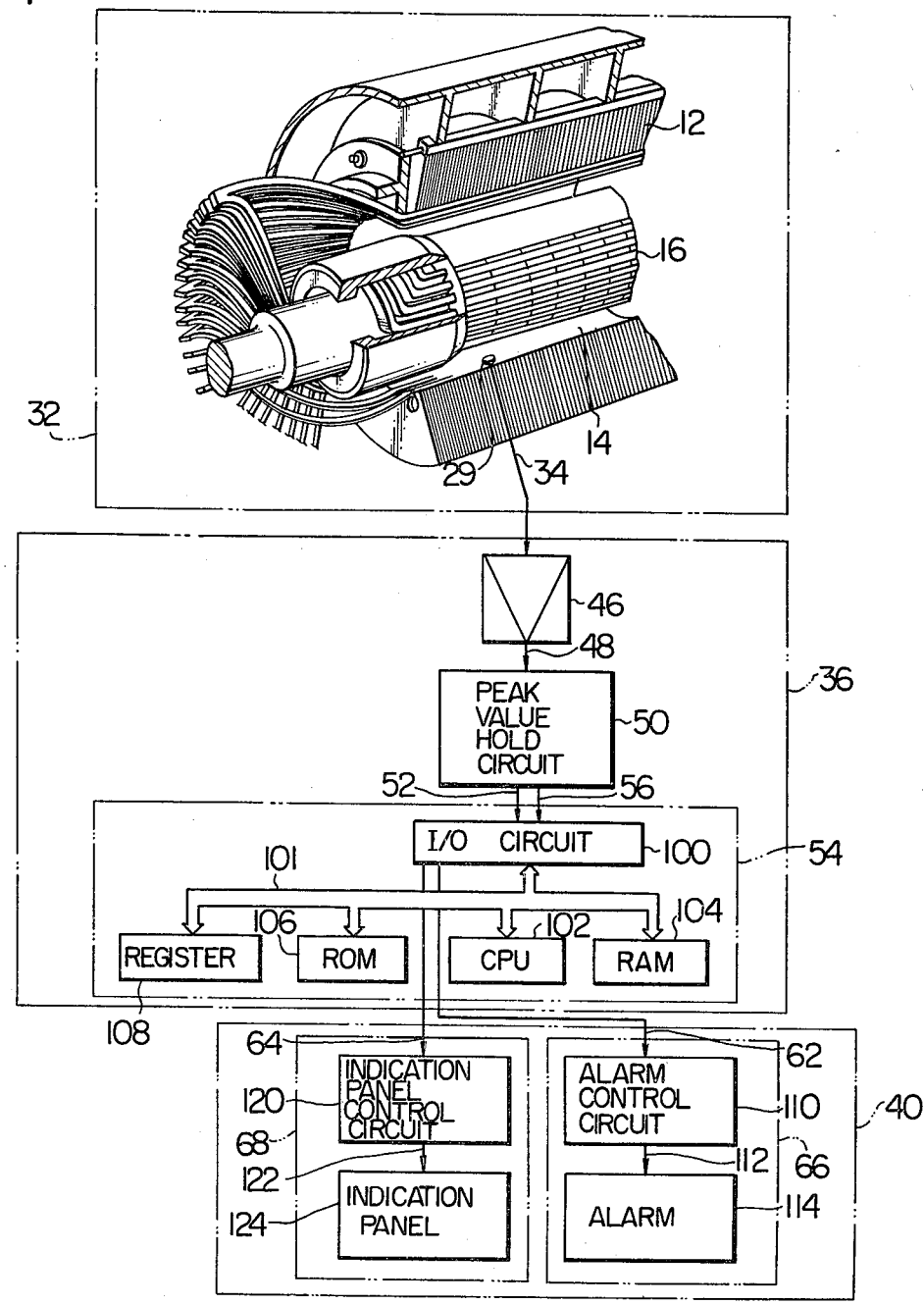
FIG. 3 shows a schematic block diagram of a fault detection apparatus for a rotor winding of a rotary machine in accordance with an embodiment of the present invention.

FIG. 3 is a block diagram schematically showing the fault detection apparatus for the rotor winding of the rotary machine in accordance with an embodiment of the present invention.

A pulsing waveform signal of a leakage flux detected by a sensing unit 32 which detects the leakage flux of the rotor winding of the rotary machine is applied to a processing unit 36 through a signal line 34. In the processing unit 36, two peak values of corresponding two slots are compared to determine the presence or absence of the fault such as interlayer short-circuit in the rotor winding. If the fault is detected, a signal for informing the fault is applied to a monitor unit 40 via a signal line 38. The monitor unit 40 indicates the presence or absence of the fault or issues an alarm signal based on the signal applied from the processing unit 36.

FIG. 4 shows a detailed block diagram of FIG. 3, in accordance with a first embodiment.

In the sensing unit 32, a magnetic flux sensor 29 (such as search coil) is provided in proximity to a surface of the rotor 16 in an air gap 14 between the stator 12 and the rotor 16. The pulsing waveform signal of the leakage flux of the rotor winding sensed by the magnetic flux sensor 29 is applied to an amplifier 46 of the processing unit 36 via the signal line 34. The amplifier 46 amplifies the input pulsing waveform signal to an appropriate amplitude and the amplified signal is applied to a peak valve hold circuit 50 via a signal line 48. The peak value hold circuit 50 detects positive and negative peaks of the input pulsing waveform signal and holds the peak values. The peak values held are applied from an output terminal of the peak value hold circuit 50 to an I/O circuit 100 of a peak value processor 54 via a signal line 52. The peak value processor 54 and the peak value hold circuit 50 are interconnected by a signal line 56 through which an initiation-of-input signal which instructs to apply the peak value held in the peak value hold circuit 50 to the peak value processor 54 is sent to the processor 54. In response to the initiation-of-input signal, the processor 54 receives the peak value supplied from the peak value hold circuit 50 via a signal line 52. The peak value hold circuit 50 holds the peak value for a time period long enough to allow the application of the peak value to the processor 54 and resets the peak value before it receives the next peak value.

Figure 5:
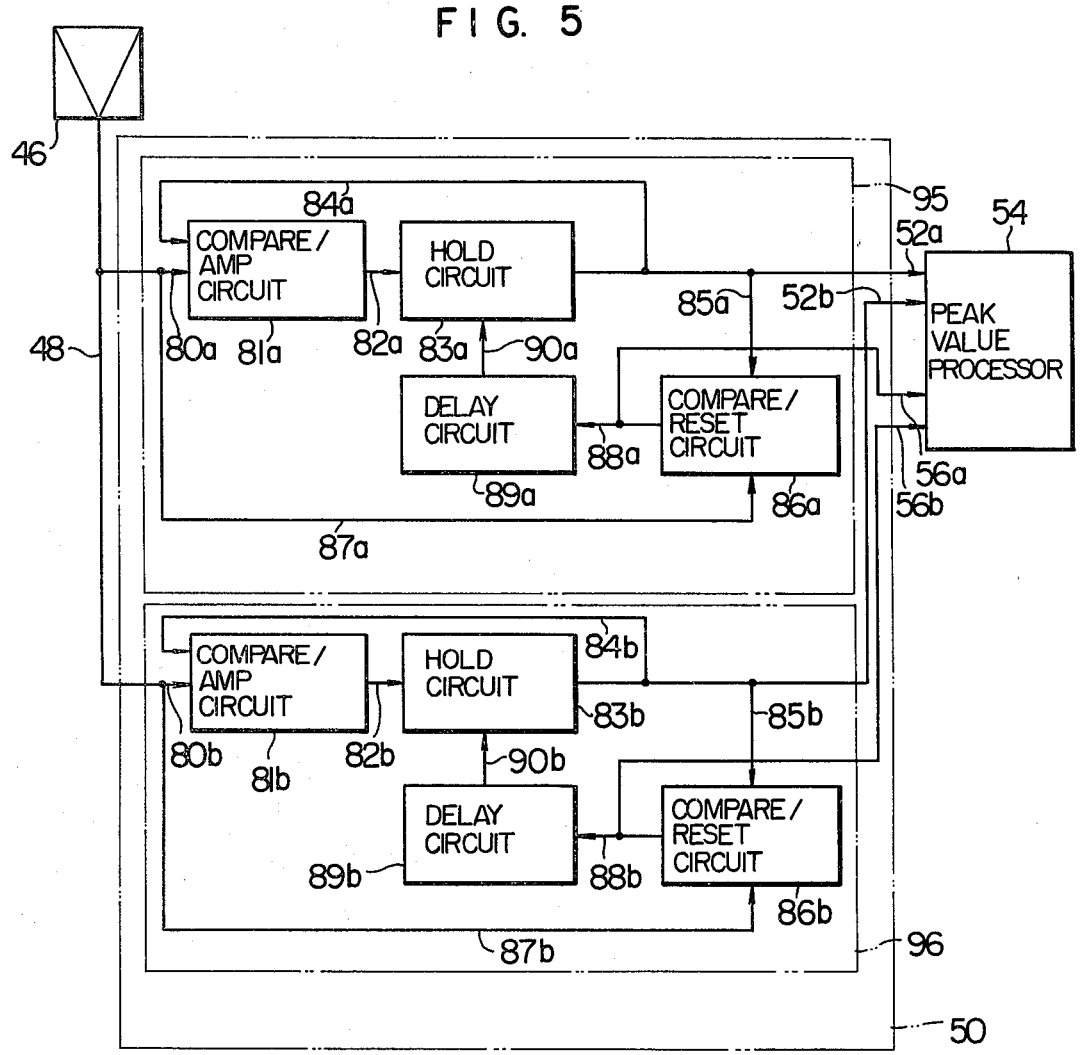
FIG. 5 is a detailed block diagram of a peak value hold circuit shown in FIG. 4.

The peak value hold circuit 50 may be constructed as shown in FIG. 5. The peak value hold circuit is divided into two major parts, one being a positive peak value hold circuit 95 which holds a positive peak value of the pulsing waveform signal shown in FIG. 2(c), which is sent via a signal line 80a and the other being a negative peak value holding circuit 96 which holds a negative peak value of the pulsing waveform signal sent via a signal line 80b. Since those hold circuits are constructed almost identically, the positive peak value hold circuit 95 is described here. It comprises a compare and amplification circuit 81a, a hold circuit 83a, a compare and reset circuit 86a and a delay circuit 89a.

Figure 6:
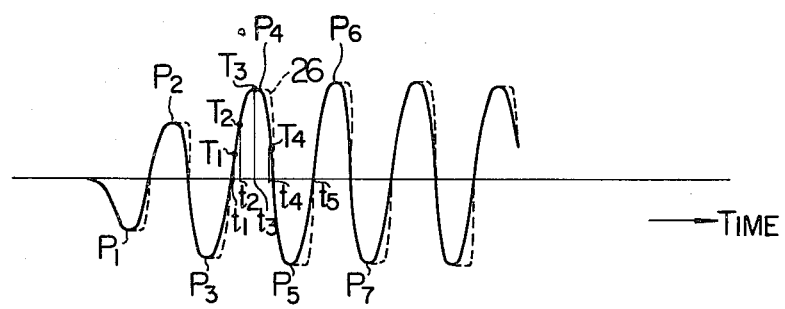
FIG. 6 is a diagram showing a pulsing waveform applied to the peak value hold circuit and a pulsing waveform taken from the peak value hold circuit.

It is assumed that a pulsing waveform signal as shown in FIG. 6 is sent via the signal line 80a, and a positive pulse, for example, a pulse $P_4$ of the received signal is received to the compare and amplification circuit 81a via the signal line 80a. An instantaneous value $T_1$ of the pulse at a time $t_1$ is amplified by the compare and amplification circuit 81a and the amplified signal is applied to the hold circuit 83a via a signal line 82a. The hold circuit 83a holds the applied instantaneous value $T_1$ and applies the held value to the other input of the compare and amplification circuit 81a via a signal line 84a. The compare and amplification circuit 81a compares the value $T_1$ applied via the signal line 84a with a current instantaneous value $T_2$ of the pulse $P_4$ applied via the signal line 80a to control the value held in the hold circuit 83a such that the value from the signal line 84a is equal to the value from the signal line 80a. That is, the compare and amplification circuit 81a provides a difference $(T_2-T_1)$ between the input values $T_1$ and $T_2$ to the hold circuit 83a so that the holding value of the hold circuit is increased to $T_2$ in order to make the difference between the input values from the signal lines 80a and 84a to be zero.

At a time $t_3$ when an instantaneous value $T_3$ is applied, the holding value of the hold circuit 83a is controlled to the value $T_3$. The instantaneous value $T_3$ is a peak value of the pulse $P_4$ and so the value which is subsequently applied via the signal line 80a decreases thereafter. As a result, the output signal of the hold circuit 83a on the signal line 84a is larger than the value from the signal line 80a and so the signal on the signal line 82a becomes negative. When the input signal to the hold circuit 83a is negative, it does not function to decrease the held signal but the peak value $T_3$ held remains unchanged. That is, the peak value $T_3$ is held after the time $t_3$ as shown by a broken line 26 in FIG. 6. The peak value $T_3$ thus held is applied to the peak value processor 54 via a signal line 52a and also applied to the compare and reset circuit 86a via a signal line 85a. The compare and reset circuit 86a compares the pulsing waveform signal applied through the signal line 87a with the signal on the signal line 85a and produces an output signal when a difference between those signals exceeds a reference level. This output signal is sent to the processor 54 via a signal line 56a as the initiation-of-input signal. As a result, the processor 54 receives the output value of the hold circuit 83a. For example, referring to FIG. 6, the values applied from the signal lines 85a and 87a at a time $t_4$ are $T_3$ and $T_4$, respectively, and a difference $(T_3-T_4)$ exceeds the reference level.

On the other hand, the output signal of the compare and reset circuit 86a is also applied to the delay circuit 89a via a signal line 88a. The delay circuit 89a produces a reset signal to reset the held value of the hold circuit 83a via a signal line 90a, a predetermined time later from the receipt of the input signal on the line 88a. Accordingly, the value held in the hold circuit 83a is reset during a time period after the time $t_4$ and before a time $t_5$ at which the next positive pulse $P_6$ appears.

The construction of the positive peak value hold circuit 95 has thus been described. The construction of the negative peak value hold circuit 96 is substantially identical to that of the positive peak value hold circuit 95 except that a compare and amplification circuit 81b and a hold circuit 83b have characteristics of holding negative peak values. The compare and amplification circuit 81b provides to the hold circuit 83b a difference between the values on the signal lines 80b and 84b such that the output value from the hold circuit 83b, which is applied to the compare and amplification circuit 81b via the signal line 84b, is equal to the instantaneous value of the negative pulse applied via the signal line 80b. The hold circuit 83b functions to reduce the holding value when the input signal thereto is negative and holds the holding value when the input signal is positive.

Since the hold circuits 83a and 83b each holds the peak value of the output signal for a predetermined time period, the output waveform is flat at the top (peak) of the waveform as shown by the broken line 26 in FIG. 6. Therefore, the application of the output waveform to the succeeding stage processor 54 is easy to attain and the peak value can be exactly trapped.

While the delay circuits 89a and 89b are used in the illustrated embodiment to reset the holding values of the hold circuits 83a and 83b, the delay circuits may not be used. In this case, when the processor 54 receives the peak value in response to the initiation-of-input signal, the processor 54 produces a hold reset signal to the hold circuit to reset the held value. Alternately, the initiation-of-input signal may be also applied to the hold circuit as a reset signal for resetting the held value thereof.

Referring to FIG. 4, the constructions of the peak value processor 54 and the monitor unit 40 are explained. The processor 54 comprises the I/O circuit 100, a central processing unit (CPU) 102, a random access memory (RAM) 104, a read-only memory (ROM) 106 which stores a program for instructing the procedures for detecting the fault of the rotor winding and a register 108 for storing data representing the peak values. Exchange of data among those units is conducted via a bus line 101 which includes a data bus, an address bus and a control bus.

When the processor 54 detects the fault of the rotor winding, signals for indicating the fault are applied to an alarm device 66 and an indicator 68 of the monitor unit 40 via signal line 62 and 64, respectively. The alarm device 66 comprises an alarm control circuit 110 and an alarm 114 such as an alarm lamp or a buzzar, and the alarm 114 issues an alarm signal upon the detection of the fault of the rotor winding. The indicator 68 comprises an indication panel control circuit 120 and an indication panel 124, and the indication panel 124 indicates the location of the fault and degree thereof (that is, degree of interlayer short-circuit) upon the detection of the fault.

Figure 7:
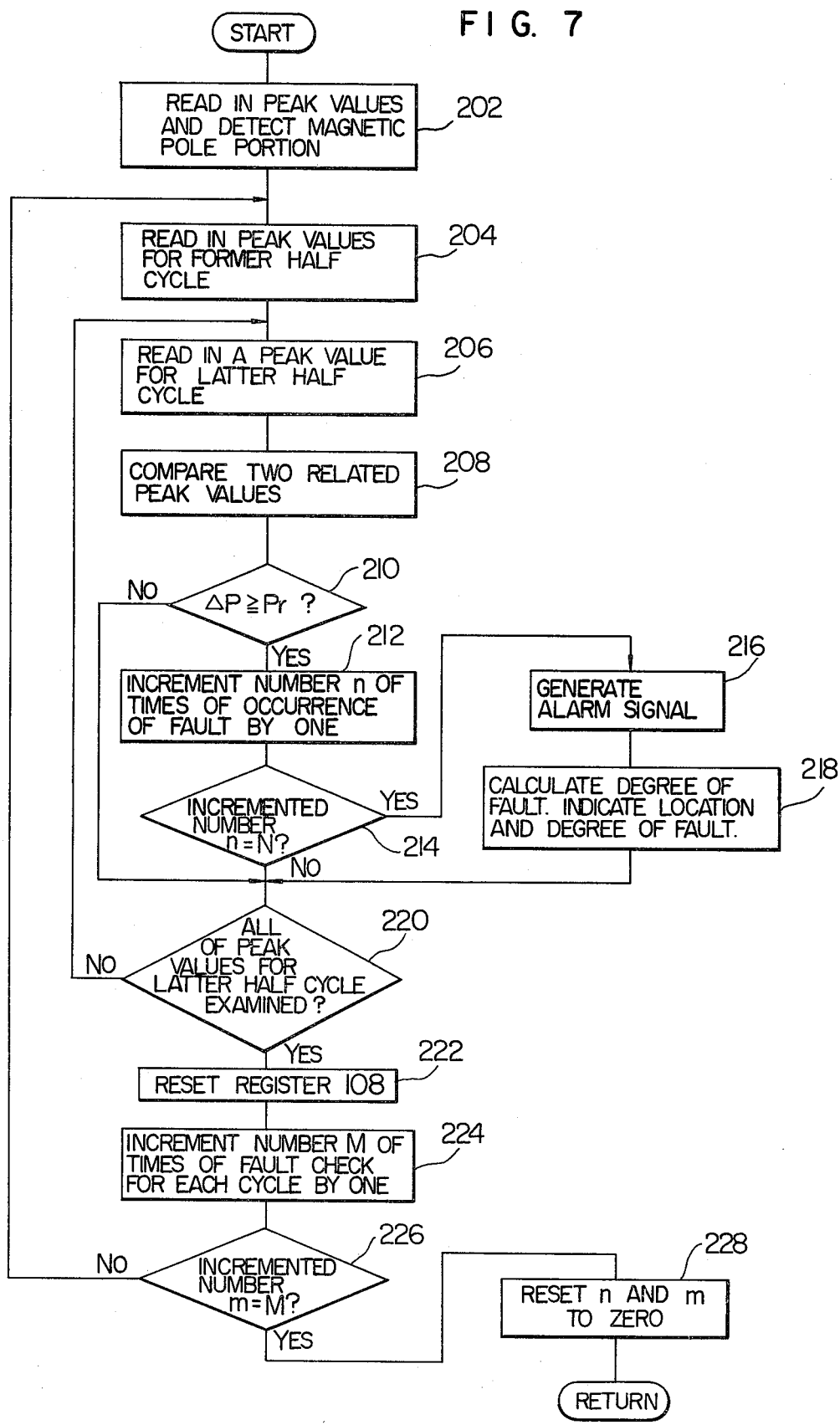
FIG. 7 shows a system flow chart showing interlayer short-circuit detection procedures for the first embodiment.

FIG. 7 shows a flow chart for the operation of the processor 54 and the monitor unit 40.

At a step 202, the I/O circuit 100 responds to the initiation-of-input signals sent from the peak value hold circuit 50 via the signal line 56 to sequentially read in the peak values from the peak value hold circuit 50 via the signal line 52. The CPU 102 discriminates the magnetic pole portion from the received peak values, that is, the slot portion corresponding to the pulses $P_1-P_n$ or $Q_1$-$Q_n$ shown in FIG. 2(c), based on a series of peak value signal patterns previously stored in the RAM 104. Now, a series of peak values for one of the slot portions corresponding to the pulses $P_1$-$P_n$ or $Q_1$-$Q_n$ are hereinafter referred to peak values for a half cycle, and a series of peak values for two of the slot portions corresponding to the pulses $P_1$-$P_n$ and $Q_1$-$Q_n$ are referred to peak values for one cycle.

At a step 204, the I/O circuit 100 reads in the first peak value for the slot portion discriminated at the step 202, e.g. a peak value of the pulse $P_1$ shown in FIG. 2(c), via the signal line 52b in response to the initiation-of-input signal applied via the signal line 56b. This value is stored in the register 108. Thereafter, the I/O circuit 100 sequentially reads in the peak values of the pulses $P_2, P_3, \ldots P_n$ in response to the initiation-of-input signals and stores them in the register 108. In this manner, all of the peak values for a former half cycle are stored in the register 108.

At a next step 206, the first peak value for the next slot portion, that is, the peak value for the pulse $Q_1$ shown in FIG. 2(c) is read.

At a step 208, the peak value for the pulse $Q_1$ and a peak value for the corresponding pulse $P_1$, which has been stored in the register 108, that is, the peak value of the pulse for the slot which is 180° out of phase relative to the slot for the pulse $Q_1$, are read and a difference $\Delta P$ between the two peak values is determined. At a step 210, it is determined if the difference exceeds a reference value Pr.

If the difference is smaller than the reference value Pr, the procedure advances to a step 220. If the difference is equal to or larger than the reference value, it is determined that the fault (interlayer short-circuit) has occurred in the conductors of the corresponding slot and the procedure goes to a step 212 where the number of times of the occurence of fault n for the slot stored in the RAM 104 is incremented by one.

At a step 214, it is determined if the incremented number of times n has reached a preset number N. If not, the procedure goes to a step 220, and if it has reached the preset number N, it is determined that the real fault condition has occurred and the procedure goes to a step 216. The reason for those steps is that the peak value detected may be lower than the corresponding peak value by more than the preset value Pr by the influence of noise or the like and may be erroneously determined as the occurrence of fault. The above steps prevent such erroneous determination.

At the step 216, a signal indicating the occurrence of the interlayer short-circuit is applied to the alarm device 66 via the signal line 62 so that the alarm 114 issues an alarm signal by the alarm lamp or the buzzer.

At a step 218, a degree of fault (degree of interlayer short-circuit) is calculated based on the difference between the two related peak values compared in the step 208, and a degree signal is applied to the indication device 68 via the signal line 64. A slot position of the rotor winding at which the real fault has occurred, that is, the slot position for the peak value read in at the step 206 is determined and a slot position signal is also applied to the indication device 68 via the signal line 64. Thus, the indicator 124 indicates the fault slot number of the rotor winding and the degree of fault. The indicator may be a CRT display or a light emitting diode display. When the above steps have been completed, the procedure goes to a step 220.

At the step 220, it is checked if all of the peak values for the latter half cycle, that is, the pulses $Q_1$-$Q_n$ shown in FIG. 2(c) have been examined. In the present case, since only the peak value for the pulse $Q_1$ has been examined, the procedure goes back to the step 206 where the peak value for the pulse $Q_2$ is read in and, at the step 208, it is compared with the peak value for the corresponding pulse $P_2$. The steps 210-218 are thereafter executed. When all of the peak values of the latter half cycle have been examined, the procedure goes to s step 222 where the peak value data for the pulses $P_1$-$P_n$ of the first half cycle, which have been stored in the registor 108, are reset.

At a step 224, the number m of times of fault check for each cycle which has been conducted in the steps 202-222, which number is stored in the RAM 104, is incremented by one, and at a step 226 it is determined if the incremented number has reached a preset number M. If not, the procedure goes back to the step 204 and the fault check is conducted for the next one cycle. If the number m has reached the preset number M, the procedure goes to a step 228 where the number m of times of fault check and the number n of times of occurrence of fault stored in the RAM 104 are reset to zero. In this manner, if the faults are detected N times or more for the same slot during the M times of fault check for each cycle, it is determined that a real fault condition has occurred, and an alarm is generated and the degree and the location of the fault are indicated.

When the above steps have been over, the procedure again goes back to the step 202 and starts a new fault check cycle.

According to the present embodiment, the peak values of the pulsing waveform of the leakage flux from the magnetic flux sensor 29 are temporarily held in the peak value hold circuit 50 and the peak values held therein are applied to the processor 54 to comply with the processing capability of the processor 54. Accordingly, the peak values can be compared correctly and the fault of the rotor winding can be detected automatically, rapidly and correctly.

Furthermore, since the process is automatic, the presence or absence of fault can be continuously monitored not only on an off-line basis but also on an on-line basis.

A criterion for determining the fault of the processor 54 is such that the fault is determined only when the fault condition occurs at a particular slot no less than a predetermined number of times within a predetermined time interval. Accordingly, an erroneous determination due to noises is prevented and the fault can be detected correctly in a short time period. In the above described embodiment, peak values for two slots deviated 180° to each other are compared for detecting the fault. In a four-pole or multi-pole rotary machine, peak values for two slots deviated by $(2n+1) \times 180°$ ($n=0, 1, 2 \ldots$) to each other may be compared.

Figure 8:
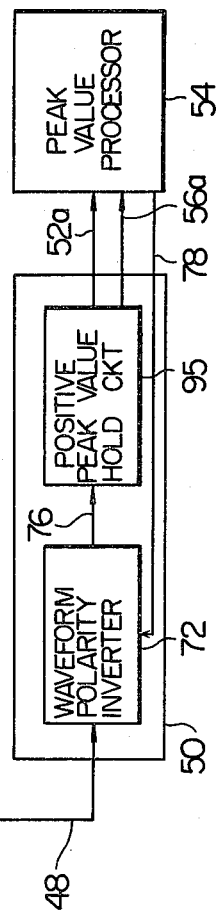
FIG. 8 shows a block diagram of the fault detection apparatus for the rotor winding of the rotary machine in accordance with a second embodiment of the present invention.

FIG. 8 shows a second embodiment of the fault detection apparatus for the rotor winding of the rotary machine in accordance with the present invention. Those elements which are identical or similar to those shown in the first embodiment are designated by the same reference numerals.

The sensing unit 32 and the monitor unit 40 are identical to those of the first embodiment.

The difference between the present embodiment and the first embodiment resides in the peak value hold the circuit 50 of the processing unit 36. The peak value hold circuit 50 of the first embodiment includes both the positive and negative peak value hold circuits 95 and 96, but the peak value hold circuit 50 of the present embodiment includes only one of them, e.g. the positive peak value hold circuit 95 and in addition, it includes a waveform polarity inverter 72.

Figure 9:
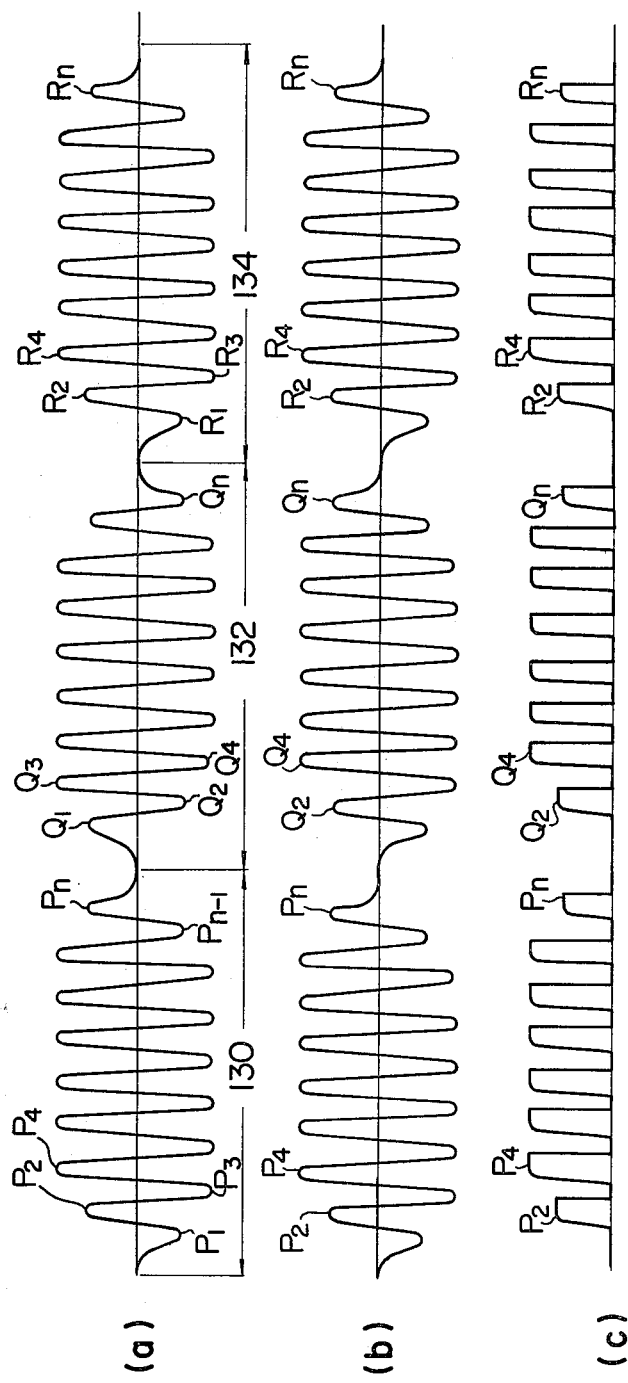
FIG. 9 shows a waveform for illustrating an operation of a peak value hold circuit shown in FIG. 8.

The waveform polarity inverter 72 inverts the polarity of the recovered pulsing waveform at every electrical angle of 180° of the rotor in response to polarity inverting signal sent from the I/O circuit 100 of the processor 54. FIG. 9(a) shows the pulsing waveform applied to the waveform polarity inverter 72. The inverter 72 passes the waveform for a half cycle (pulses $P_1$-$P_n$) shown by reference numeral 130 as it is but inverts the polarity of the waveform for a next half cycle pulses ($Q_1$-$Q_n$) shown by reference numeral 132, and passes the waveform for a next half cycle (pulses $R_1$-$R_n$) shown by reference numeral 134. As a result, a signal waveform as shown in FIG. 9(b) is applied to the positive peak value hold circuit 95 via a signal line 76.

Accordingly, the positive peak value hold circuit 95 produces an output waveform as shown in FIG. 9(c) on the signal line 52a. The peak values of the pulses $P_2$-$P_n$ of the half cycle shown in FIG. 9(c) are applied to the I/O circuit 100 of the processor 54 in response to the initiation-of-input signals applied to the I/O circuit 100 via the signal line 56a and they are sequentially stored in the register 108. The peak value of the pulse $P_2$ is compared with the peak value of the pulse $Q_2$ of the next half cycle, and then the peak values of the pulses $P_4$-$P_n$ are sequentially compared with the peak values of the pulses $Q_4$-$Q_n$, respectively.

In the present embodiment, the step 204 or 206 shown in FIG. 7 may be conducted by applying the polarity inverting signal for a half cycle shown by the reference numeral 132 to the circuit 72 via the signal line 78. The other steps are identical to the flow chart of FIG. 7.

In the present embodiment, the positive peak value hold circuit 95 may be replaced by the negative peaks value hold circuit 96.

According to the present embodiment, the circuit components of the peak value hold circuit 50 can be reduced to approximately one half of those in the first embodiment.

Accordingly, the present embodiment requires less number of circuit components than the first embodiment and hence the construction is simpler. Consequently, the present embodiment is less expensive and more reliable. The other advantages are same as those of the first embodiment.

The present invention is applicable not only to the turbine generator but also to other rotary machines, and further not only to the two-pole rotor but also to four-pole or multi-pole rotor.

As described hereinabove, the present invention provides the fault detection apparatus for the rotor winding of the rotary machine in which the pulsing waveform from the sensor is temporarily held in the peak value hold circuit before it is applied to the processor, whereby the fault such as interlayer short-circuit of the rotor winding can be automatically, rapidly and correctly detected and indicated.

What is claimed is:

1. A fault detection apparatus for a rotor winding of a rotary machine comprising;
    a magnetic flux sensor mounted in proximity to a surface of a rotor having said rotor winding wound thereon, said rotor being mounted in a stator of said rotary machine while leaning an air gap therebetween, said magnetic flux sensor sensing a leakage flux of said rotor winding in each slot of said rotor,
    a peak value hold circuit for detecting peak values of a pulsing waveform of the signal supplied from said magnetic flux sensor, holding said peak values for a predetermined time period and then resetting the held value,
    a register for storing past peak values,
    a peak value processor for comparing the peak value held in said peak value hold circuit with the corresponding one of the peak values stored in said register, and
    a monitor for indicating a fault in said rotor winding, said processor determining the presence or absence of the fault in said rotor winding based on a result of the comparison of the corresponding peak values and applying a signal indicative of the fault to said monitor when the fault is determined.

2. A fault detection apparatus for a rotor winding of a rotary machine according to claim 1, wherein said peak value hold circuit holds positive and negative peak values of said pulsing waveform, and said processor compares the peak value of said pulsing waveform applied thereto with the corresponding one of the peak value stored in said register which is an odd-number time of 180° out of phase relative to the peak value applied thereto from said peak value hold circuit and of opposite polarity, respectively.

3. A fault detection apparatus for a rotor winding of a rotary machine according to claim 1, wherein said peak value hold circuit includes a waveform polarity inverter and a waveform hold circuit, said waveform polarity inverter inverting the pulsing waveform applied from said magnetic sensor at every electrical angle of 180° in response to an instruction from said processor and applying the inverted waveform to said waveform hold circuit, said waveform hold circuit detecting peak values of one polarity and holding said peak values for a predetermined time period, and said processor compares the peak value of the pulsing waveform applied thereto with the corresponding one of the peak values stored in said register which are odd-number time of 180° out of phase relative to the peak value applied thereto from said peak value hold circuit.

4. A fault detection apparatus for a rotor winding of a rotary machine according to claim 1, 2 or 3, wherein while said peak value hold circuit holds the detected peak values of the pulsing waveform applied thereto for the predetermined time period, said peak value hold circuit issues an instruction signal to said processor for instructing to said processor to read in the peak value from said peak value hold circuit, and thereafter resets the held value and then detects and holds the next peak value.

5. A fault detection apparatus for a rotor winding of a rotary machine according to claim 4, wherein said peak value hold circuit includes a hold circuit for holding peak value of an input pulse applied thereto, a circuit for comparing the peak value held in said hold circuit with an instantaneous value of said input pulse and producing said instruction signal when a difference obtained by the comparison reaches a preset level and for supplying to said hold circuit said instruction signal as a reset signal for resetting the holding value of said hold circuit.

6. A fault detection apparatus for a rotor winding of a rotary machine according to claim 4, wherein said processor supplies to said hold circuit a reset signal for resetting the holding value when said processor has received the peak value from said hold circuit in response to said instruction signal.

7. A fault detection apparatus for a rotor winding of a rotary machine according to claim 4, wherein said peak value hold circuit includes a hold circuit for holding peak value of an input pulse applied thereto, a circuit for comparing the peak value held in said hold circuit with an instantaneous value of said input pulse and producing said instruction signal when a difference obtained by the comparison reaches a preset level, and a delay circuit for supplying to said hold circuit a reset signal for resetting the holding value of said hold circuit a predetermined time late from the application of said instruction signal.

8. A fault detection apparatus for a rotor winding of a rotary machine according to claim 1, wherein said peak values are respectively corresponding to the slots of said rotor, and said processor determines the presence of the fault in the rotary winding of the slot when a difference obtained by the comparison of the corresponding two peak values for the slot, said processor determining the presence of the real fault when the fault is determined more than a first predetermined number of times for the same slot during a second predetermined number times of the comparison of the corresponding two peak values and applying said signal indicative of the fault to said monitor when the real fault is determined.

9. A fault detection apparatus for a rotor winding of a rotary machine according to claim 8, wherein said processor calculates a degree of the fault based on the difference between the two corresponding peak values and determines a slot position at which the real fault has occurred, said processor applying a signal representing the degree of the fault and the slot position and an alarm signal to said monitor as said signal indicative of the fault, said monitor indicating the degree of the fault and the slot number at which the real fault has occurred and generating an alarm in response to said signals from said processor.

* * * * *